(12) United States Patent
Ishiduki et al.

(10) Patent No.: US 8,786,008 B2
(45) Date of Patent: *Jul. 22, 2014

(54) NONVOLATILE SEMICONDUCTOR MEMORY DEVICE AND METHOD FOR MANUFACTURING THE SAME

(75) Inventors: Megumi Ishiduki, Mie-ken (JP); Masaru Kidoh, Mie-ken (JP); Mitsuru Sato, Mie-ken (JP); Masaru Kito, Mie-ken (JP); Ryota Katsumata, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 132 days.

This patent is subject to a terminal disclaimer.

(21) Appl. No.: 13/420,745

(22) Filed: Mar. 15, 2012

(65) Prior Publication Data

US 2013/0056815 A1 Mar. 7, 2013

(30) Foreign Application Priority Data

Sep. 2, 2011 (JP) ................................. 2011-191733

(51) Int. Cl.
*H01L 29/792* (2006.01)
*H01L 21/336* (2006.01)

(52) U.S. Cl.
USPC .......................................... 257/326; 438/259

(58) Field of Classification Search
USPC .......... 438/257–261, 241, 266; 257/324–326, 257/E29.3–E29.309
See application file for complete search history.

(56) References Cited

U.S. PATENT DOCUMENTS

| 2010/0207195 | A1 | 8/2010 | Fukuzumi et al. | |
|---|---|---|---|---|
| 2010/0244119 | A1* | 9/2010 | Fukuzumi et al. | 257/324 |
| 2011/0284947 | A1 | 11/2011 | Kito et al. | |

OTHER PUBLICATIONS

Japanese Office Action issued Dec. 20, 2013 in Patent Application No. 2011-191733 with English Translation..

* cited by examiner

*Primary Examiner* — Calvin Lee
(74) *Attorney, Agent, or Firm* — Oblon, Spivak, McClelland, Maier & Neustadt, L.L.P.

(57) ABSTRACT

According to one embodiment, a nonvolatile semiconductor memory device includes: a first stacked body; a memory film; a first channel body layer provided inside the memory film; an interlayer insulating film provided on the first stacked body; a second stacked body having a select gate electrode layer, and a second insulating layer; a gate insulating film provided on a side wall of a second hole communicating with the first hole and penetrating the second stacked body and the interlayer insulating film in a stacking direction of the second stacked body; and a second channel body layer provided inside the gate insulating film in the second hole. A first pore diameter of the second hole at an upper end of the select gate electrode layer is smaller than a second pore diameter of the second hole at an lower end of the select gate electrode layer.

17 Claims, 14 Drawing Sheets

US 8,786,008 B2

NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2011-191733, filed on Sep. 2, 2011; the entire contents of which are incorporated herein by reference.

FIELD

Embodiments described herein relate generally to a nonvolatile semiconductor memory device and a method for manufacturing the same.

BACKGROUND

There is a memory device in which memory cells are three-dimensionally aligned by forming a memory hole in a stacked body where a plurality of electrode layers functioning as control gates in the memory cells and a plurality of insulating layers are alternately stacked, forming a charge storage film on a side wall of the memory hole, and then providing silicon serving as a channel in the memory hole.

As a data erasing method specific to such three-dimensional stacked memory, there is proposed an erasing method using a GIDL (Gate Induced Drain Leakage) current. For using the erasing method, a high-concentration impurity diffusion region is required in a channel body layer in the vicinity of an upper end of a select gate provided on the memory cell. In addition, in this kind of memory device, it is desired that a threshold voltage of a select gate is more stable.

BRIEF DESCRIPTION OF THE DRAWINGS

FIGS. 3A and 3B are cross-sectional schematic views of the nonvolatile semiconductor memory device according to the first embodiment, wherein FIG. 3A is a cross-sectional schematic view in the Y-direction of the down side from the source line of FIG. 1, and FIG. 3B is an enlarged view of the vicinity of the select gate in FIG. 3A;

DETAILED DESCRIPTION

Figure 1:
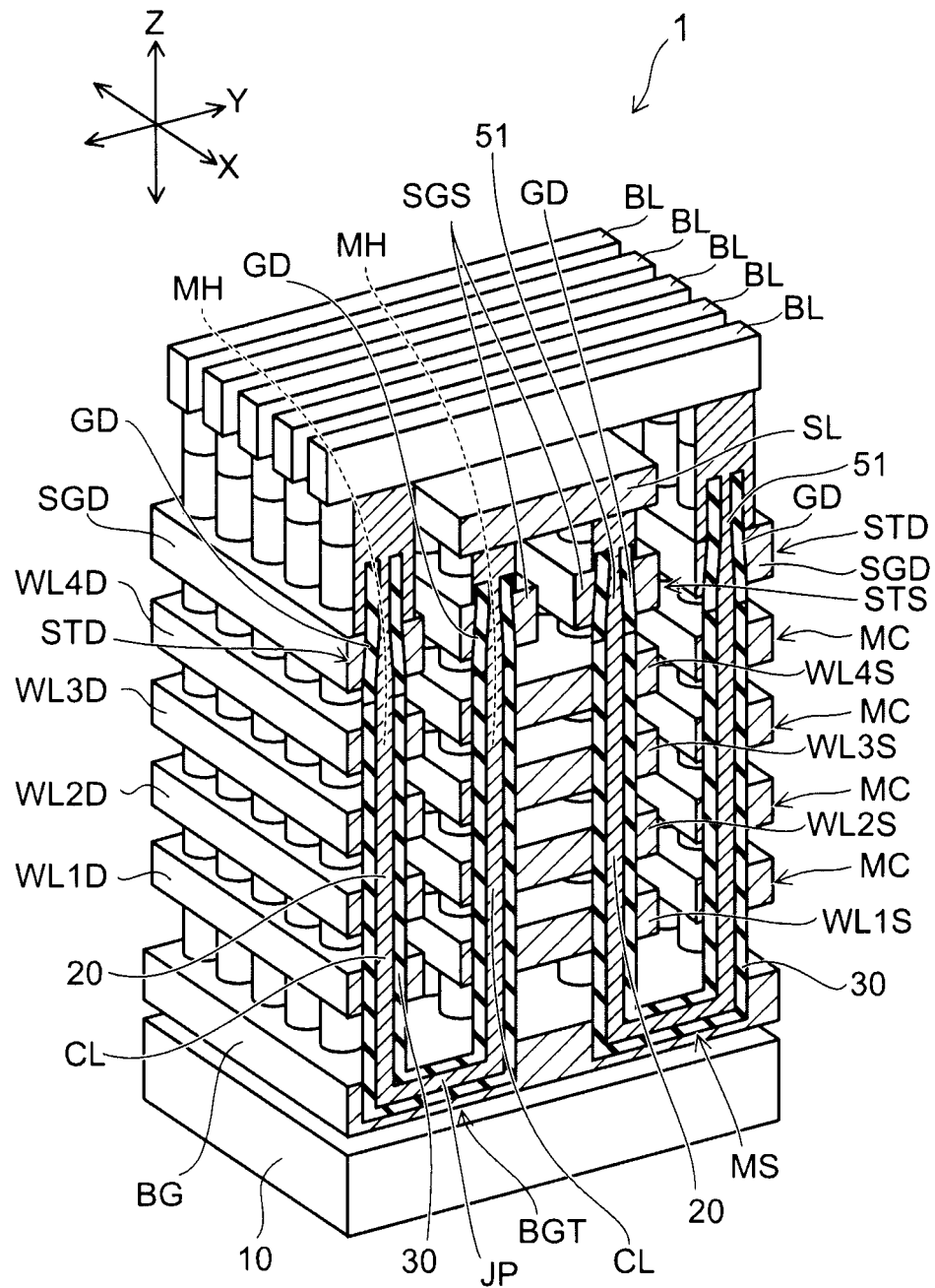
FIG. 1 is a schematic perspective view of a memory cell array of a nonvolatile semiconductor memory device according to a first embodiment.

In general, according to one embodiment, a nonvolatile semiconductor memory device, includes: a first stacked body having a plurality of electrode layers and a plurality of first insulating layers which are stacked alternately; a memory film provided on a side wall of a first hole penetrating the first stacked body in a stacking direction of the first stacked body; a first channel body layer provided inside the memory film provided in the first hole; an interlayer insulating film provided on the first stacked body; a second stacked body having a select gate electrode layer provided on the interlayer insulating film, and a second insulating layer provided on the select gate electrode layer; a gate insulating film provided on a side wall of a second hole communicating with the first hole and penetrating the second stacked body and the interlayer insulating film in a stacking direction of the second stacked body; and a second channel body layer provided inside the gate insulating film in the second hole, and connected to the first channel body layer. A first pore diameter of the second hole of the select gate electrode layer side in a first interface between the select gate electrode layer and the second insulating layer is smaller than a second pore diameter of the second hole of the select gate electrode layer side in a second interface between the select gate electrode layer and the interlayer insulating film.

In general, according to another embodiment, a nonvolatile semiconductor memory device includes: a first stacked body having a plurality of electrode layers and a plurality of first insulating layers which are stacked alternately; a memory film provided on a side wall of a first hole penetrating the first stacked body in a stacking direction of the first stacked body; a first channel body layer provided inside the memory film provided in the first hole; an interlayer insulating film provided on the first stacked body; a second stacked body having a select gate electrode layer provided on the interlayer insulating film, and a second insulating layer provided on the select gate electrode layer; a gate insulating film provided on a side wall of a second hole communicating with the first hole and penetrating the second stacked body and the interlayer insulating film in a stacking direction of the second stacked body; and a second channel body layer provided inside the gate insulating film in the second hole, and connected to the first channel body layer. A first pore diameter of the second hole at an upper end of the select gate electrode layer is smaller than a second pore diameter of the second hole at an lower end of the select gate electrode layer.

In general, according to another embodiment, a method for manufacturing a nonvolatile semiconductor memory device includes: forming a first stacked body including a plurality of electrode layers and a plurality of first insulating layers stacked alternately; forming an interlayer insulating film on the first stacked body; forming a second stacked body stacked in order of a select gate electrode layer and a second insulating layer on the interlayer insulating film; forming a first hole penetrating the first stacked body in a stacking direction of the first stacked body, and a second hole penetrating the second stacked body and the interlayer insulating film in a stacking direction of the second stacked body to communicate with the first hole; forming a step part between the select gate electrode layer and the second insulating layer in a first interface of the select gate electrode layer and the second insulating layer; forming a memory film on a side wall of the first hole, and forming a gate insulating film on a side wall of the second hole; forming a first channel body layer inside the memory film, and forming a second channel body layer connected to the first channel body layer inside the gate insulating film; and injecting an impurity element into the second channel body layer covering the step part through the second hole. In forming the second hole, a diameter of the second hole is adjusted so that a first pore diameter of the second hole provided in the select gate electrode layer side in the first interface is smaller than a second pore diameter of the second hole provided in the select gate electrode layer side in a second interface between the select gate electrode layer and the interlayer insulating film.

Embodiments of the invention will be described with reference to the drawings. In the following descriptions, like members are marked with like numerals, and the description of the described members is omitted as appropriate.

FIG. 1 is a schematic perspective view of a memory cell array of a nonvolatile semiconductor memory device according to a first embodiment. In FIG. 1, for clarification, an insulating part other than an insulating film formed on an inner wall of a memory hole MH is not shown.

Figure 2:
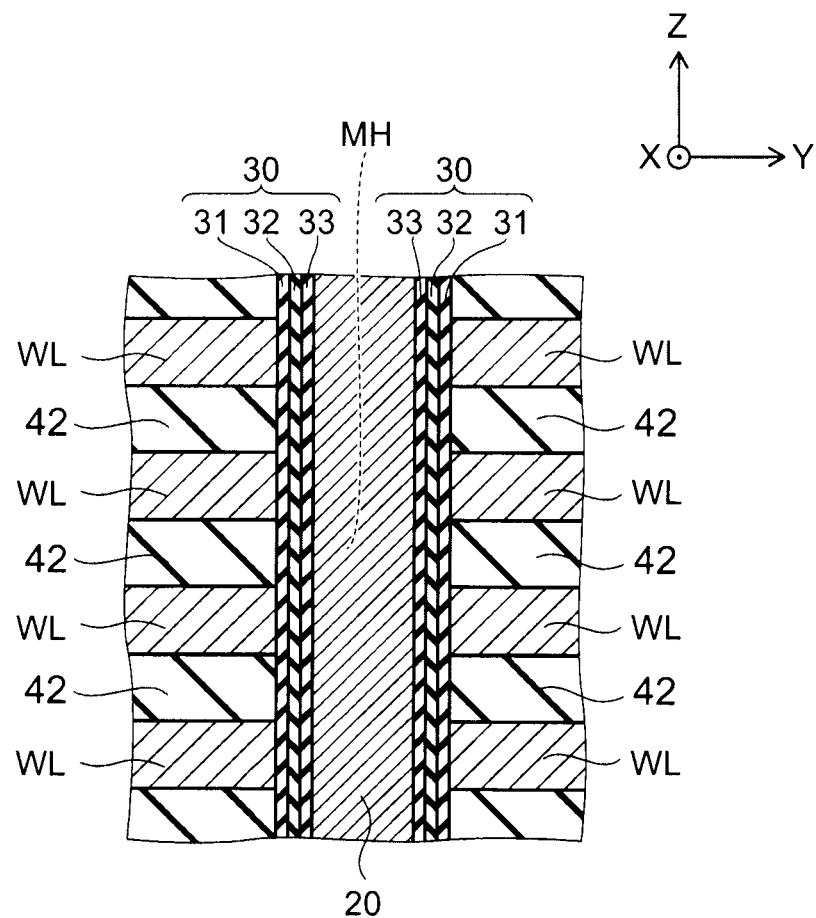
FIG. 2 is an enlarged cross-sectional view showing a region in which memory cells in FIG. 1 are provided.

FIG. 2 is an enlarged cross-sectional view showing the region in which memory cells in FIG. 1 are provided.

Furthermore, in FIG. 1, for convenience of explanation, an XYZ rectangular coordinate system is introduced. In this coordinate system, two directions which are parallel to a major surface of a substrate 10 and which are orthogonal to each other are defined as an X-direction and a Y-direction, and a direction which is orthogonal to both the X-direction and the Y-direction is defined as a Z-direction.

In FIG. 1, a back-gate BG is provided on the substrate 10 via an insulating layer which is not illustrated. The substrate 10 together with the insulating layer serves as a foundation layer. The back-gate BG is a silicon layer to which an impurity element is added and which has electrical conductivity, for example.

A plurality of insulating films 42 (shown in FIG. 2) and a plurality of electrode layers WL1D, WL2D, WL3D, WL4D, WL1S, WL2S, WL3S, and WL4S are alternately stacked on the back gate BG.

The electrode layer WL1D and the electrode layer WL1S are provided on the same layer and represent the first electrode layers from the bottom. The electrode layer WL2D and the electrode layer WL2S are provided on the same layer and represent the second electrode layers from the bottom. The electrode layer WL3D and the electrode layer WL3S are provided on the same layer and represent the third electrode layers from the bottom. The electrode layer WL4D and the electrode layer WL4S are provided on the same layer and represent the fourth electrode layers from the bottom.

The electrode layer WL1D is separated from the electrode layer WL1S in the Y-direction. The electrode layer WL2D is separated from the electrode layer WL2S in the Y-direction. The electrode layer WL3D is separated from the electrode layer WL3S in the Y-direction. The electrode layer WL4D is separated from the electrode layer WL4S in the Y-direction.

Figure 3A:
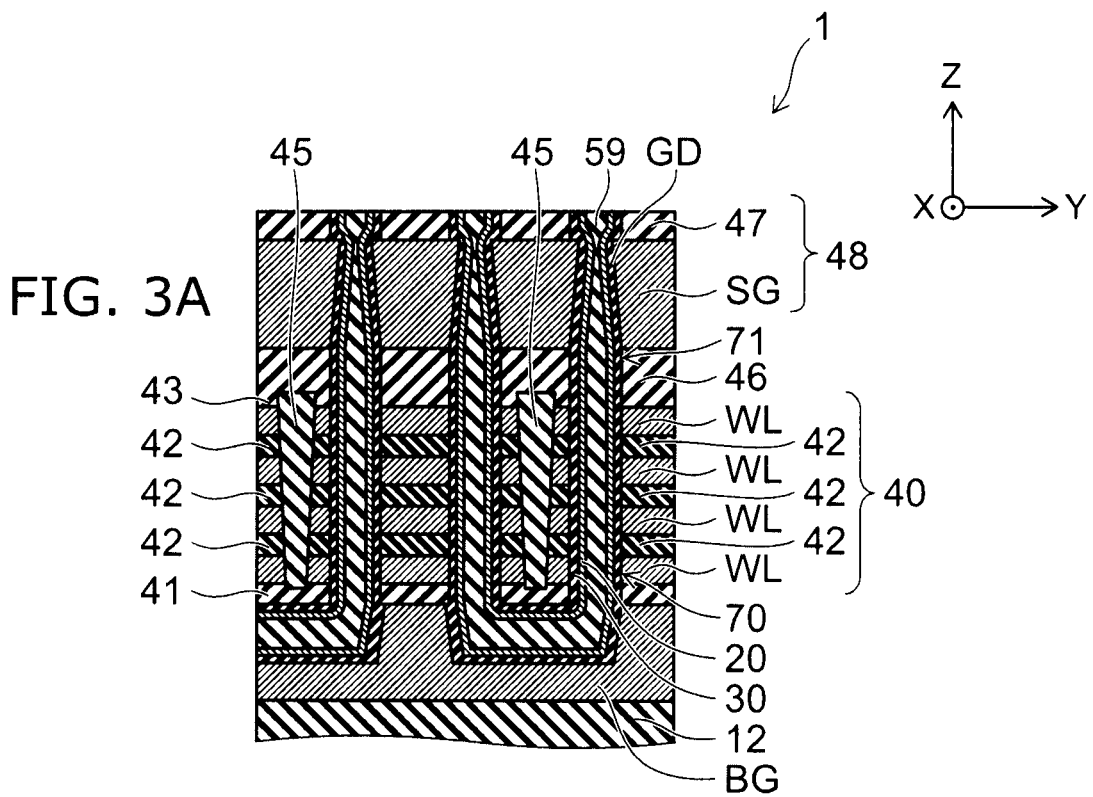

Insulating films 45 shown in FIG. 3A are provided between the electrode layer WL1D and the electrode layer WL1S, between the electrode layer WL2D and the electrode layer WL2S, between the electrode layer WL3D and the electrode layer WL3S, and between the electrode layer WL4D and the electrode layer WL4S.

The electrode layers WL1D to WL4D are provided between the back-gate BG and a drain side select gate SGD. The electrode layers WL1S to WL4S are provided between the back-gate BG and the source side select gate SGS. The "select gate" may be referred to as a "select gate electrode layer".

The number of layers of the electrode layers is arbitrary, and is not limited to four layers as illustrated in FIG. 1. In the following description, there is a case in which each of electrode layer WL1D to WL4D, and WL1S to WL4S is expressed merely as an electrode layer WL.

The electrode layer WL is a silicon layer in which an impurity element is added and which has electrical conductivity, for example. The insulating layer 42 is a TEOS (tetraethoxysilane) layer containing a silicon oxide, for example.

On the electrode layer WL4D, the drain side select gate SGD is provided. The drain side select gate SGD is a silicon layer in which an impurity element such as boron is added and which has electrical conductivity, for example.

On the electrode layer WL4S, the source side select gate SGS is provided. The source side select gate SGS is a silicon layer to which, for example, an impurity element such as boron is added and which has electrical conductivity.

The drain side select gate SGD is separated from the source side select gate SGS in the Y-direction. In the following description, there is a case in which each of the drain side select gate SGD and the source side select gate SGS is expressed merely as a select gate SG without being discriminated.

On the source side select gate SGS, a source line SL is provided. The source line SL is a metal layer.

On the drain side select gate SGD and the source line SL, a plurality of bit lines BL are provided. Each bit line BL extends in the Y-direction.

In the back-gate BG and the stacked body on the back-gate BG, a plurality of U-shaped memory holes MH are formed. In the electrode layers WL1D to WL4D and the drain side select gate SGD, a hole which penetrates them and extends in the Z-direction is formed. In the electrode layers WL1S to WL4S and the source side select gate SGS, a hole which penetrates them and extends in the Z-direction is formed. The pair of holes extending in the Z-direction are connected via a concave portion 81 (shown in FIG. 6B) formed in the back-gate BG, and constitutes the U-shaped memory hole MH.

Inside the memory hole MH, channel body layers 20 and 51 are provided in a U-shaped form. Each of the channel body layers 20 and 51 is, for example, a silicon layer. Between the channel body layer 20 and the inner wall of the memory hole MH, a memory film 30 is provided.

There is provided a gate insulating film GD between the drain side select gate SGD and the channel body layer 51 and between the source side select gate SGS and the channel body layers 51.

In addition, in FIG. 1, not only a structure in which the whole of the inside of the memory hole MH are filled with the channel body layer, but also a structure in which the channel body layer is formed so that a hollow part remains on a central axis side of the memory hole MH may also be possible. Alternatively, a structure in which an insulator is embedded in a hollow part inside the channel body layer may also be possible.

Between each electrode layer WL and the channel body layer 20 in a memory cell transistor (hereinafter, simply referred to as a memory cell), a block film 31 as a first insulating film, a charge storage film 32 and a tunnel film 33 as a second insulating film in order from the electrode layer WL side as shown in FIG. 2 are provided. A group of the block film 31, the charge storage film 32 and the tunnel film 33 is set as the memory film 30. The block film 31 contacts the electrode layer WL, and the tunnel film 33 contacts the channel body layer 20, and the charge storage film 32 is provided between the block film 31 and the tunnel film 33.

The channel body layer 20 functions as a channel and diffusion layer (source/drain) in the memory cell transistor, and the electrode layer WL functions as a control gate, and the charge storage film 32 functions as a data storage layer which stores a charge injected from the channel body layer 20. That is, at a crossing part of the channel body layer 20 and each of electrode layers WL, a memory cell having the structure in which the control gate surrounds the circumference of the channel is formed. The structure is not limited to one in which a center portion of the hole facing the tunnel film 33 is embedded by the channel body layer 20 alone. That is, the structure may be the one in which the channel body layer 20 is formed in a thin film so that a hollow part remains inside the hole, and may be the one having a stacked film shape forming a new insulating film inside the channel body layer 20.

A nonvolatile semiconductor memory device 1 of an embodiment is a nonvolatile semiconductor memory device capable of performing erasing and writing of data electrically freely, and of holding a memory content even if the power is turned off.

The memory cell is, for example, a charge trap-type memory cell. The charge storage film 32 has a lot of trap sites for trapping electrical charge and is, for example, a silicon nitride film.

The tunnel film 33 is, for example, a silicon oxide film and serves as a potential barrier when the charge is injected into the charge storage film 32 from the channel body layer 20, or when a charge stored in the charge storage film 32 is diffused into the channel body layer 20.

The block film 31 is, for example, a silicon oxide film and prevents a charge stored in the charge storage film 32 from diffusing to the electrode layer WL.

The drain side select gate SGD, the channel body layer 51 and the gate insulating film GD between them constitute a drain side selection transistor STD. The channel body layer 51 in the drain side selection transistor STD is connected to the bit line BL.

The source side select gate SGS, the channel body layer 51, and the gate insulating film GD between them constitute a source side selection transistor STS. The channel body layer 51 in the source side selection transistor STS is connected to the source line SL.

In the following description, there is a case in which each of the drain side selector transistor STD and the source side selector transistor STS is expressed merely as a selector transistor ST without being discriminated.

The back-gate BG, the channel body layer 20 and memory film 30 which are provided in the back-gate BG constitute a back-gate transistor BGT.

Between the drain side selection transistor STD and the back-gate transistors BGT, a plurality of memory cells MC in which each of electrode layers WL4D to WL1D is a control gate are provided. Similarly, also between the back-gate transistor BGT and the source side selection transistor STS, a plurality of memory cells MC in which each of electrode layers WL1S to WL4S is a control gate is provided.

These plurality of memory cells MC, the drain side selection transistor STD, the back-gate transistor BGT and the source side selection transistor STS are connected in series through the channel body layers 20 and 51, and constitute a one U-shaped memory strings MS.

The one memory strings MS has a pair of columnar parts CL extending in a stacking direction of the stacked body including a plurality of electrode layers WL, and a coupling part JP which is embedded in the back-gate BG and couples lower ends of the pair of the columnar parts CL. By the plurality of memory strings MS being aligned in the X-direction and the Y-direction, a plurality of memory cells MC are provided in the X-direction, the Y-direction and the Z-direction three-dimensionally.

The plurality of memory strings MS are provided in a memory cell array region in the substrate 10. In the periphery, for example, of the memory cell array region in the substrate 10, a peripheral circuit which controls the memory cell array is provided.

Figure 3B:
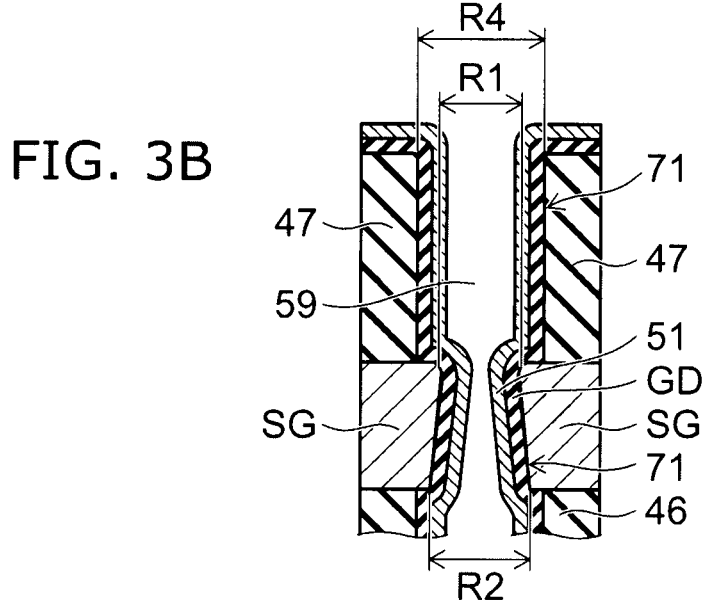

FIGS. 3A and 3B are cross-sectional schematic views of the nonvolatile semiconductor memory device according to the first embodiment, and FIG. 3A is a cross-sectional schematic view in the Y-direction of the down side from the source line of FIG. 1, and FIG. 3B is an enlarged view of the vicinity of the select gate in FIG. 3A.

The nonvolatile semiconductor memory device 1 according to the first embodiment includes the foundation layer 12, and includes, on the foundation layer 12, a stacked body 40 (a first stacked body) having a plurality of the electrode layers WL and a plurality of insulating layers 42 (a first insulating layer) which are each alternately stacked. The foundation layer 12 has, for example, an element, wiring, an interlayer insulating film, etc. The plurality of electrode layers WL denote, as shown in FIG. 1, a group of electrode layers WL1D to WL4D, or a group of electrode layers WL1S to WL4S.

The nonvolatile semiconductor memory device 1 includes the memory film 30 provided on a side wall of a hole 70 (a first hole) formed by penetrating the stacked body 40 in a stacking direction of the stacked body 40. The nonvolatile semiconductor memory device 1 includes the channel body layer 20 (a first channel body layer) provided inside the memory film 30 provided in the hole 70. The nonvolatile semiconductor memory device 1 includes an interlayer insulating film 46 provided on the stacked body 40.

The nonvolatile semiconductor memory device 1 includes a stacked body 48 (a second stacked body) on the interlayer insulating film 46. The stacked body 48 has the select gate SG and an insulating layer 47 (a second insulating layer) provided on the select gate SG. The select gate SG is, as shown in FIG. 1, the drain side select gate SGD or the source side select gate SGS.

The nonvolatile semiconductor memory device 1 includes the gate insulating film GD provided on a side wall of a hole 71 (a second hole) formed by communicating with the hole 70 and penetrating the stacked body 48 and the interlayer insulating film 46 in a stacking direction of the stacked body 48. The nonvolatile semiconductor memory device 1 includes the channel body layer 51 (a second channel body layer) which is provided inside the gate insulating film GD in the hole 71, and is connected to the channel body layer 20. The channel body layer 20 and the channel body layer 51 communicate with each other, and forms an integrated channel body layer. Inside the channel body layers 20 and 51 in the hole, an insulating layer 59 which is a core material is embedded.

In the nonvolatile semiconductor memory device 1, a pore diameter R1 (a first pore diameter) of the hole 71 at the side of the select gate SG in an interface (a first interface) between the select gate SG and the insulating layer 47 is smaller than a pore diameter R2 (a second pore diameter) of the hole 71 at the side of the select gate SG in an interface (a second interface) between the select gate SG and the insulating layer 46.

That is, the pore diameter R1 of the hole 71 at an upper end of the selecti gate SG is smaller than the pore diameter R2 of the hole 71 at a lower end of the select gate SG In the nonvolatile semiconductor memory device 1, the pore diameter of the hole 71 becomes large gradually from the interface between the select gate SG and the insulating layer 47, toward the interface between the select gate SG and the interlayer insulating film 46. A cross-sectional shape of the hole 71 is a so-called reverse tapered shape from the interface between the select gate SG and the insulating layer 47 toward the interface between the select gate SG and the interlayer insulating film 46. As for a relation between the pore diameter R1 and a pore diameter R4 (a fourth pore diameter) of the hole 71 at the side of the insulating layer 47 in the interface between the select gate SG and the insulating layer 47, R4 becomes larger than R1.

That is, the pore diameter R4 of the hole 71 at a lower end of the insulating layer 47 is larger than the pore diameter R1.

For example, R4 is set to be larger than R1 by more than 10 nanometers (nm). A difference between the pore diameter R1 and the pore diameter R2 is, for example, 5 nanometers or more. A thickness of the select gate SG is, for example, 200 nanometers.

In the nonvolatile semiconductor memory device 1, an erasing operation of data is an operation to perform extraction of an electron from the charge storage film 32, or injection of an hole into the charge storage film 32. A transistor constituting the memory cell MC with the electrode layer WL being a control gate has a state where a threshold voltage is relatively low (erasing state), and a state where a threshold voltage is relatively high (writing state). Then, the erasing operation is an operation which sets the threshold voltage of the memory cell MC to the state of the low side.

In a memory having a general two-dimensional structure, an electron written in a floating gate is extracted by increasing a substrate potential. However, in a three-dimensional structure such as the nonvolatile semiconductor memory device 1, a channel of a memory cell is not directly connected to a substrate. Therefore, there is used a method of boosting a channel potential of a memory cell through the use of a GIDL (Gate Induced Drain Leakage) current generated in a channel at a select gate end.

That is, by applying a high voltage to a diffusion region which is formed in the channel body layer 51 in the vicinity of the upper end of the select gate SG, and in which an impurity element is added in a high concentration, a high electric field is caused to be generated in a depletion layer formed between the select gate SG and the diffusion region. Thereby, a channel potential is increased by generating tunneling between bands and by supplying the generated hole to the channel body layers 51 and 20. By setting an electric potential of the electrode layer WL, which is a control gate to, for example, a ground potential (0 V), an electron of the charge storage film 32 is extracted or a hole is injected into the charge storage film 32 due to a potential difference between the channel body layer 20 and the electrode layer WL, and thus an erasing operation is performed. In order to increase a speed of the erasing operation, it is required that a diffusion region containing an impurity element in a high concentration in the channel body layer 51 in the vicinity of the upper end of the select gate SG is formed.

For example, a density of an impurity element contained in the channel body layer 51 provided in the hole 71 formed by penetrating through the insulating layer 47 is not less than $5\times10^{19}$ (atoms/cm$^3$). Then, a manufacturing process in which the nonvolatile semiconductor memory device 1 is manufactured will be described.

FIGS. 4A to 6B are cross-sectional schematic views for explaining the manufacturing process of the nonvolatile semiconductor memory device according to the first embodiment.

Figure 4A:
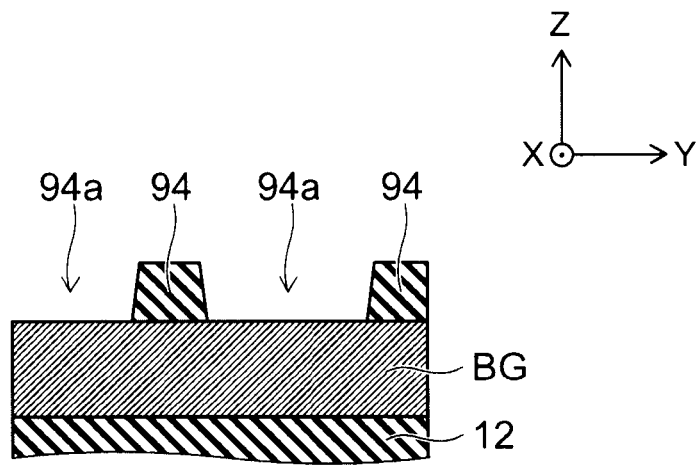
FIGS. 4A to 4D are cross-sectional schematic views for explaining the manufacturing process of the nonvolatile semiconductor memory device according to the first embodiment.

First, as shown in FIG. 4A, a back-gate BG is formed on the foundation layer 12. The back-gate BG is a silicon layer with an impurity element such as boron doped, for example. Subsequently, a resist pattern 94 is formed on the back-gate BG. The resist pattern 94 has an opening 94a which is opened selectively.

Figure 4B:
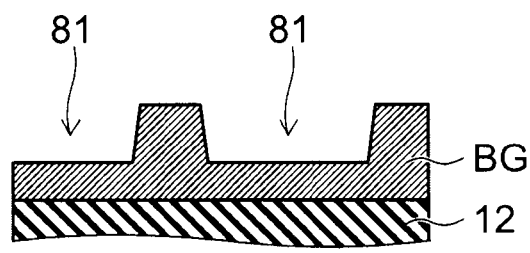

Next, as shown in FIG. 4B, dry etching of the back-gate BG is carried out selectively with the resist pattern 94 masked. Thereby, a concave portion 81 is formed in the back-gate BG.

Figure 4C:
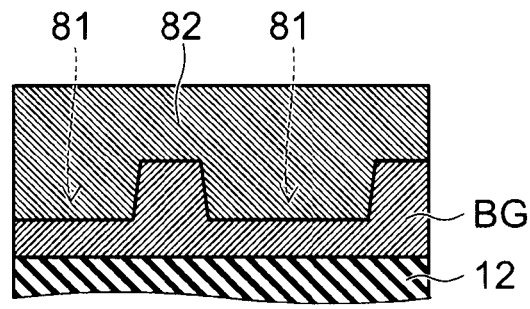
Figure 4D:
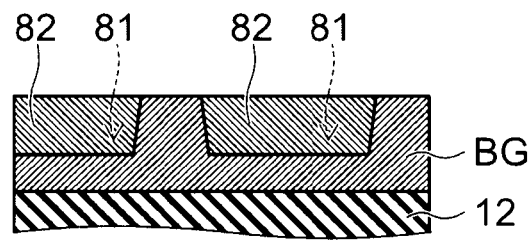

Then, as shown in FIG. 4C, a sacrifice film 82 is embedded in the concave portion 81. The sacrifice films 82 are a silicon nitride film, a non-doped silicon film, etc., for example. Subsequently, the sacrifice film 82 is etched back, and as shown in FIG. 4D, the surface of the back-gate BG between the concave portion 81 and the concave portion 81 is exposed.

Figure 5A:
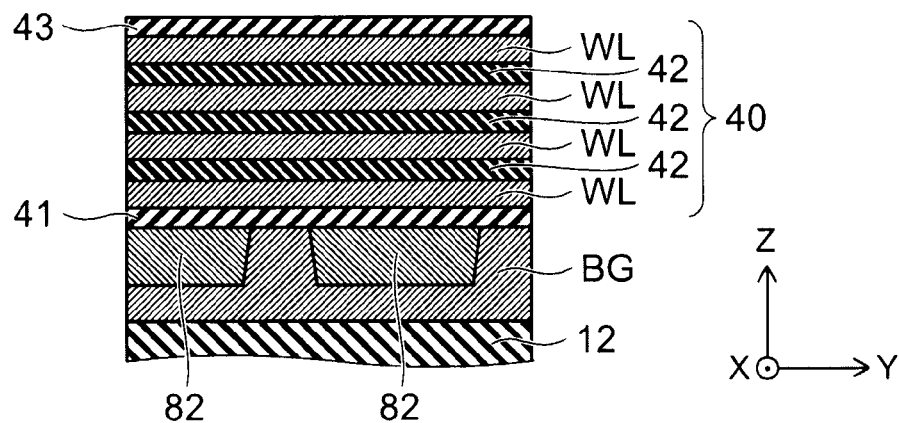
FIGS. 5A to 5C are cross-sectional schematic views for explaining the manufacturing process of the nonvolatile semiconductor memory device according to the first embodiment.

Next, as shown in FIG. 5A, after forming an insulating film 41 on the back-gate BG, the stacked body 40 including a plurality of the electrode layer WL and a plurality of the insulating layers 42 is formed via the insulating film 41 on the foundation layer 12. The electrode layer WL and the insulating layer 42 are stacked alternately, and the insulating layer 42 is interposed between the electrode layers WL. Subsequently, an insulating film 43 is formed on the electrode layer WL of the uppermost layer of the stacked body 40.

Figure 5B:
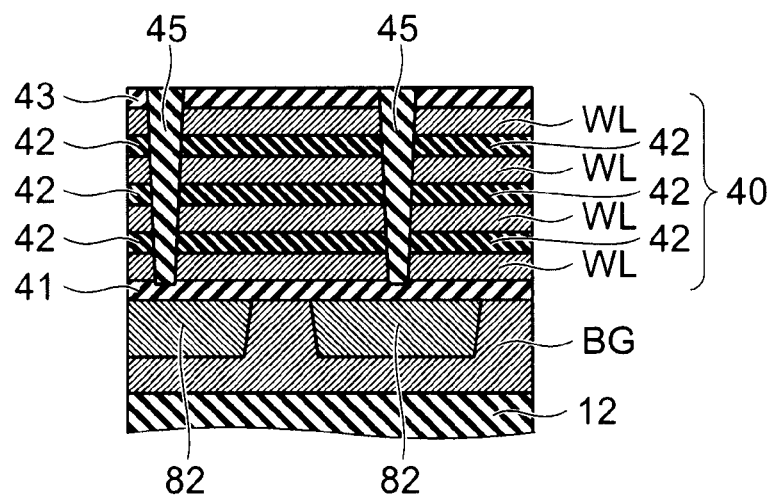

Then, by a photolithography and etching, the stacked body 40 is separated in the Y-direction, a groove which reaches the insulating film 41 is formed, and thereafter, an insulating film 45 is embedded in the groove. This state is shown in FIG. 5B. In FIG. 5B, the insulating film 45 is etched back, and the surface of the insulating film 43 and an upper face of the insulating film 45 lie in the same plane.

Figure 5C:
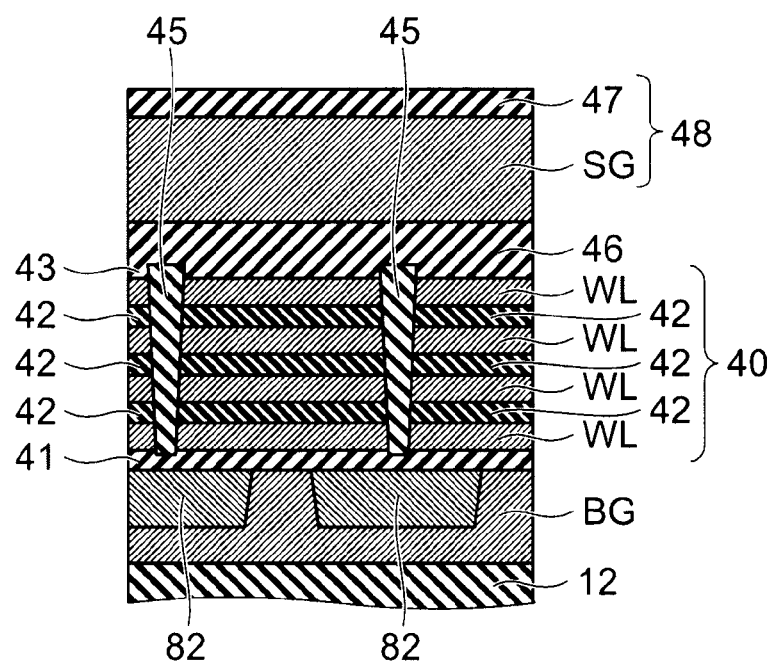
Figure 6A:
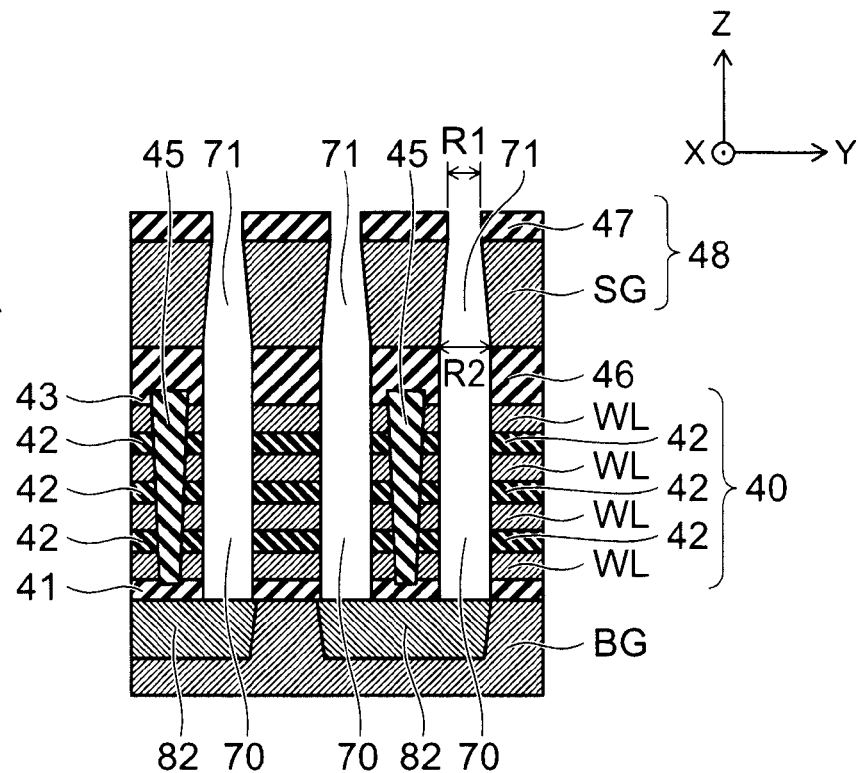
FIGS. 6A and 6B are cross-sectional schematic views for explaining the manufacturing process of the nonvolatile semiconductor memory device according to the first embodiment.

After that, as shown in FIG. 5C, the interlayer insulating film 46 is formed via the insulating film 43 on the stacked body 40. In addition, on the interlayer insulating film 46, the stacked body 48 stacked in order of the select gate SG and the insulating layer 47 from a lower layer is formed. Subsequently, the select gate SG is formed on the interlayer insulating film 46. In addition, the insulating layer 47 is formed on the select gate SG. In FIG. 6A and subsequent figures, indication of the foundation layer 12 will be omitted.

Next, as shown in FIG. 6A, the hole 70 which penetrates the stacked body 40 in a stacking direction of the stacked body 40, and the hole 71 which penetrates the stacked body 48 and the interlayer insulating film 46 in a stacking direction of the stacked body 48 and communicates with the hole 70 are formed. The holes 70 and 71 are formed by RIE (Reactive Ion Etching), using a mask which is not illustrated.

In the first embodiment, in the case of forming the hole 71, the pore diameter R1 is adjusted so as to become smaller than the pore diameter R2. By adjusting etching gas, temperature, pressure, or the like of the RIE in order to realize the above-mentioned hole shape, in the first embodiment, as shown in FIG. 3B, RIE processing is performed so that a pore diameter of the hole 71 becomes large gradually from the interface between the select gate SG and the insulating layer 47 toward the interface between the select gate SG and the interlayer insulating film 46.

For example, the RIE processing according to the first embodiment is carried out so that the pore diameter of the hole 71 becomes large gradually from the interface between the select gate SG and the insulating layer 47 toward the interface between the select gate SG and the interlayer insulating film 46, by adjusting oxygen (O), a carbon fluoride (CF) based gas, types of gas such as a chlorine (Cl), flow rates of these gases, pressure in an etching apparatus, etching time, or the like.

In the first embodiment, as the process goes from the interface between the select gate SG and the insulating layer 47, toward the interface between the select gate SG and the interlayer insulating film 46, an etching rate is increased and a process is caused to proceed. Alternatively, in the first embodiment, as the process goes from the interface between the select gate SG and the insulating layer 47, toward the interface between the select gate SG and the interlayer insulating film 46, the process is caused to proceed on the condition that re-deposition of an atom and molecule removed by etching becomes difficult to be generated.

By this RIE, a lower end of the hole 70 reaches the sacrifice film 82, and at the lowermost part of the hole 70, the sacrifice film 82 is exposed. A pair of holes 70 are located on one sacrifice film 82 so as to sandwich the insulating film 45 located substantially in the center of the sacrifice film 82.

Figure 6B:
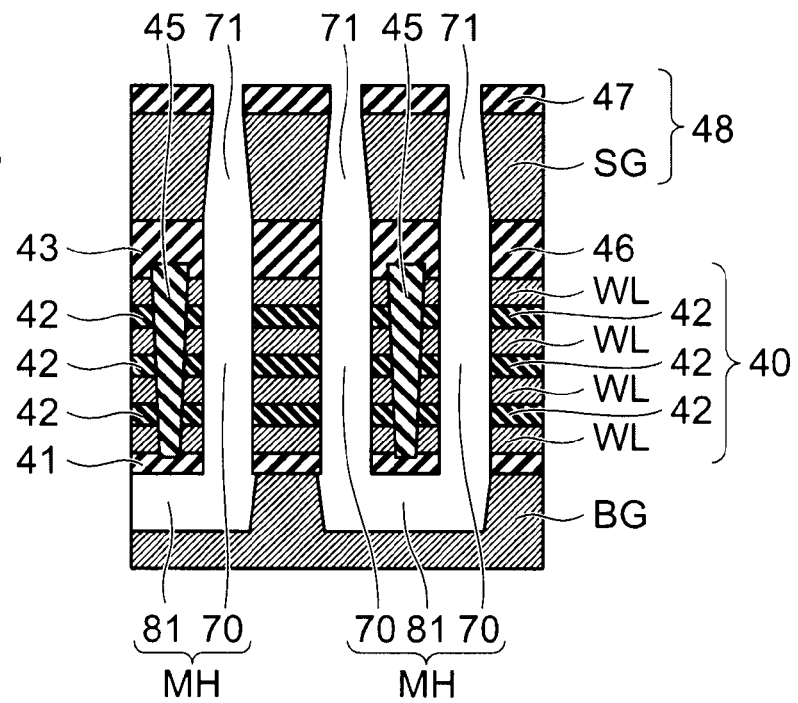

Then, as shown in FIG. 6B, the sacrifice film 82 is removed by wet etching, for example, through holes 70 and 71. As an etching solution, for example, an alkaline chemical solution such as a KOH (potassium hydroxide) solution, or a phosphoric acid solution ($H_3PO_4$) with an etching rate adjusted depending on a temperature condition is used.

Thereby, the sacrifice film 82 is removed, and the concave portion 81 is formed in the back-gate BG. Per one concave portion 81, a pair of holes 70 are connected. That is, each lower end of a pair of holes 70 is connected to one common concave portion 81, and one U-shaped memory hole MH is formed.

After that, in the stacked body 40 including a plurality of electrode layers WL, the memory film 30 is formed on an inner wall of the hole 70 as shown in FIGS. 2 and 3A. Inside the memory film 30 in the hole 70, a silicon film is formed as the channel body layer 20.

Figure 7A:
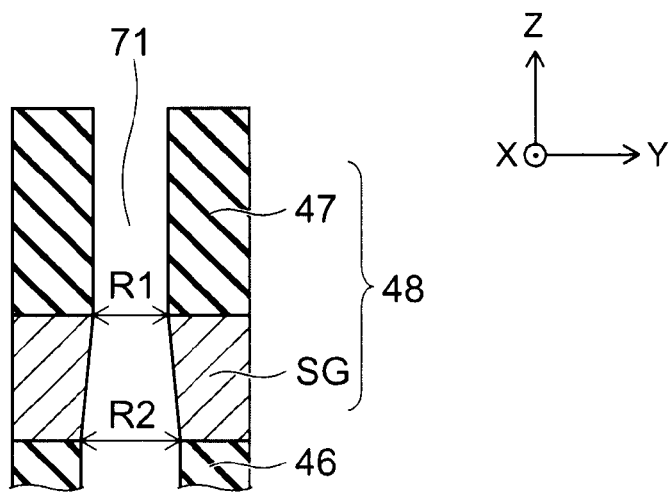
FIGS. 7A to 7C are cross-sectional schematic views for explaining the manufacturing process of the nonvolatile semiconductor memory device according to the first embodiment.

In contrast, for the stacked body 48 which includes the select gate SG, processing is caused to proceed by a process after FIG. 7A. FIGS. 7A to 9B are cross-sectional schematic views for explaining a manufacturing process of the nonvolatile semiconductor memory device according to the first embodiment.

First, in FIG. 7A, a state where the hole 71 is formed in the stacked body 48 and the interlayer insulating film 46 is shown.

As mentioned above, in forming the hole 71, the RIE processing is performed so that a pore diameter of the hole 71 becomes large gradually from the interface between the select gate SG and the insulating layer 47 toward the interface between the select gate SG and the interlayer insulating film 46 (R1<R2).

Figure 7B:
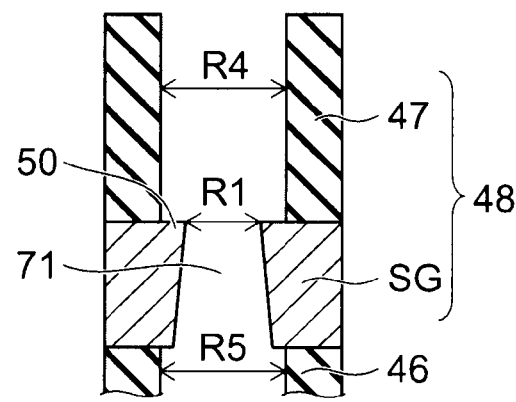

Then, as shown in FIG. 7B, an acid treatment is performed in the hole 71 by using dilute hydrofluoric acid. By this treatment, a side wall of the silicon-oxide-based insulating layer 47 is etched. In addition, the dilute-hydrofluoric-acid treatment serves as both the removal of deposits by the RIE at the time of forming the hole 71 and the film formation pretreatment of the gate insulating film GD.

By the dilute-hydrofluoric-acid treatment, the side wall of the hole 71 side of the insulating layer 47 is moved back in a direction apart from the center of the hole 71. Therefore, a step part 50 is formed between the select gate SG and the insulating layer 47. A difference between the pore diameter R1 and the pore diameter R4 (fourth pore diameter) of the hole 71 of the insulating layer 47 side in the interface between the select gate SG and the insulating layer 47 is, for example, not less than 10 nanometers (nm). A moving-back amount of the side wall of the insulating layer 47 is, for example, 5 nanometers or more. In this way, the pore diameter R4 is larger than the pore diameter R1, and in the interface of the select gate SG and the insulating layer 47, the step part 50 is formed between the select gate SG and the insulating layer 47.

Furthermore, a pore diameter R5 of the interlayer insulating film 46 expands in dimension like in the case of the insulating layer 47 by the dilute-hydrofluoric-acid treatment. Therefore, for the purpose of preventing short-circuiting with an adjacent bit, the pore diameter R5 of the interlayer insulating film 46 is set as a dimension smaller than a dimension in advance after the dilute-hydrofluoric-acid treatment. For example, when a difference between the pore diameter R4 and the pore diameter R1 is 10 nanometers, an adjustment is carried out so that a difference between the pore diameter R5 before the dilute-hydrofluoric-acid treatment and the pore diameter R5 after the dilute-hydrofluoric-acid treatment is also 10 nanometers.

Figure 7C:
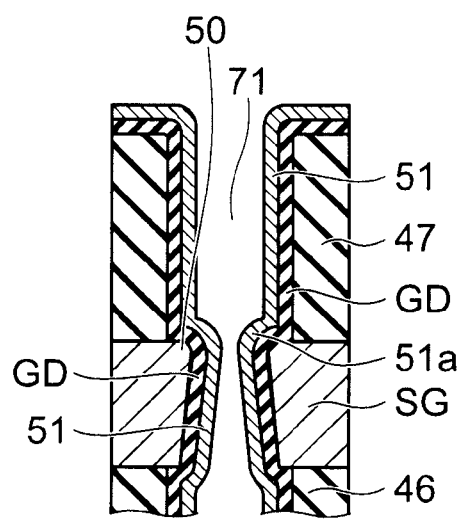

Then, as shown in FIG. 7C, the gate insulating film GD is formed on the side wall of the hole 71. The gate insulating film GD covers this step part 50 along the step part 50. Therefore, a step part is formed also in the gate insulating film GD. The gate insulating film GD is formed by, for example, CVD (chemical vapor deposition) method. A material of the gate insulating film GD is a silicon oxide film or a silicon nitride film. Then, on the inner wall of the hole 70 in the stacked body 40 including a plurality of electrode layers WL, the memory film 30 mentioned above is formed (refer to FIG. 3A). That is, the memory film 30 is formed on the side wall of the hole 70, and the gate insulating film GD is formed on the side wall of the hole 71.

Subsequently, inside the gate insulating film GD in the hole 71, an amorphous silicon layer which is the channel body layer 51 is formed by the CVD method. Then, the amorphous silicon layer is crystallized by a heat treatment, and the channel body layer 51 is formed into a polycrystalline silicon layer. Then, inside the memory film 30 in the hole 70, as the channel body layer 20, a silicon layer is formed (refer to FIG. 3A). That is, inside the memory film 30, the channel body layer 20 is formed, and inside the gate insulating film GD, the channel body layer 51 connected to the channel body layer 20 is formed.

Moreover, the channel body layer 51 covers the step part 50 with the gate insulating film GD interposed. Therefore, the step part 51a is formed also in the channel body layer 51. As mentioned above, it is required that a high-concentration impurity element is contained in the channel body layer 51 in the vicinity of the upper end of the select gate SG. Therefore, the high-concentration impurity element is injected into the step part 51a of the channel body layer 51.

Figure 8A:
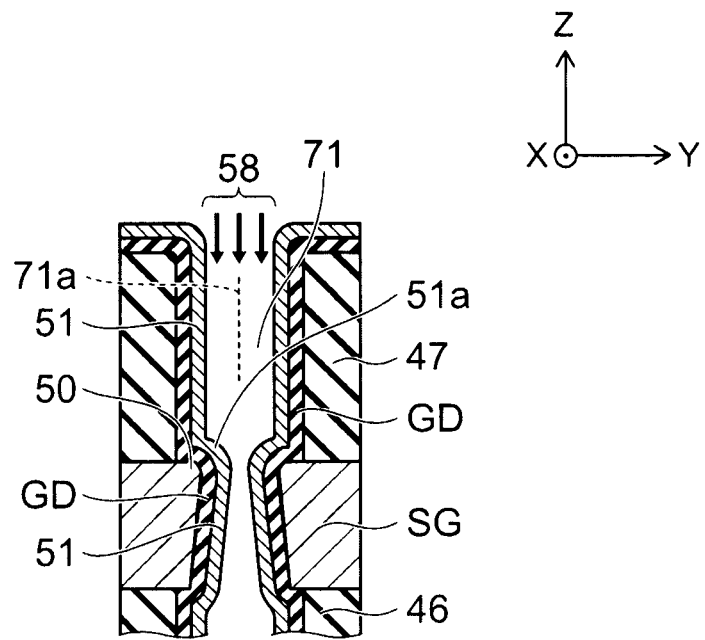
FIGS. 8A and 8B are cross-sectional schematic views for explaining the manufacturing process of the nonvolatile semiconductor memory device according to the first embodiment.

For example, as shown in FIG. 8A, through the hole 71, an impurity element is injected into the step part 51a of the channel body layer 51. The impurity element is incident substantially parallel to a central axis 71a of the hole 71. For example, an n-type impurity 58 such as arsenic (As) and phosphorus (P), is injected to the step part 51a of the channel body layer 51. The n-type impurity 58 is incident parallel to a direction in which the hole 71 extends, for example.

In the channel body layer 51, the step part 51a is projected toward a center of the hole 71. Therefore, an injection efficiency of the impurity for the step part 51a of the channel body layer 51 becomes higher than for the side face of the channel body layer 51 provided on the side wall of the hole 71 formed in the insulating layer 47. Therefore, after injection of the n-type impurity 58, the step part 51a of the channel body layer 51 has an impurity concentration relatively higher than other portions.

In the first embodiment, the pore diameter of the hole 71 becomes large gradually from the interface between the select gate SG and the insulating layer 47 toward the interface between the select gate SG and the interlayer insulating film 46. Therefore, also a pore diameter in the channel body layer 51 which contacts the select gate SG via the gate insulating film GD becomes large gradually from the interface between the select gate SG and the insulating layer 47 toward the interface between the select gate SG and the interlayer insulating film 46.

Therefore, even if the n-type impurity 58 enters, through the hole 71, into a portion lower than the step part 51a, the step part 51a of the channel body layer 51 serves as a shielding part (mask) of n-type impurity 58, and the n-type impurity 58 is difficult to be injected in the channel body layer 51 which contacts the gate insulating film GD.

Figure 8B:
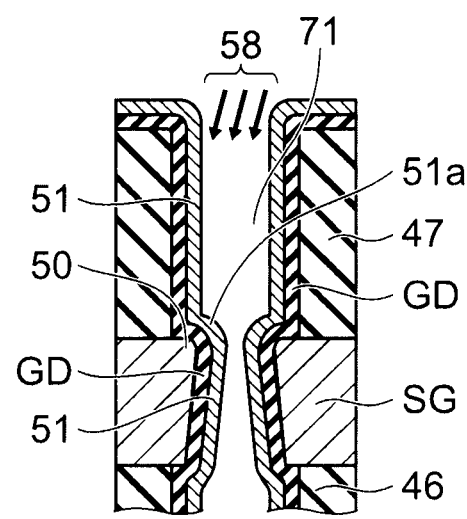

Next, as shown in FIG. 8B, the n-type impurity 58 is caused to be incident, through the hole 71, obliquely to the side wall of the hole 71, and the n-type impurity 58 is injected into the channel body layer 51 higher than the step part 51a of the channel body layer 51. An angle between the n-type impurity 58 which is obliquely incident and a direction in which the hole 71 extends is, for example, 5 degrees. Thereby, a parasitic resistance of the channel body layer 51 which contacts the insulating layer 47 via the gate insulating film GD is decreased.

Figure 9A:
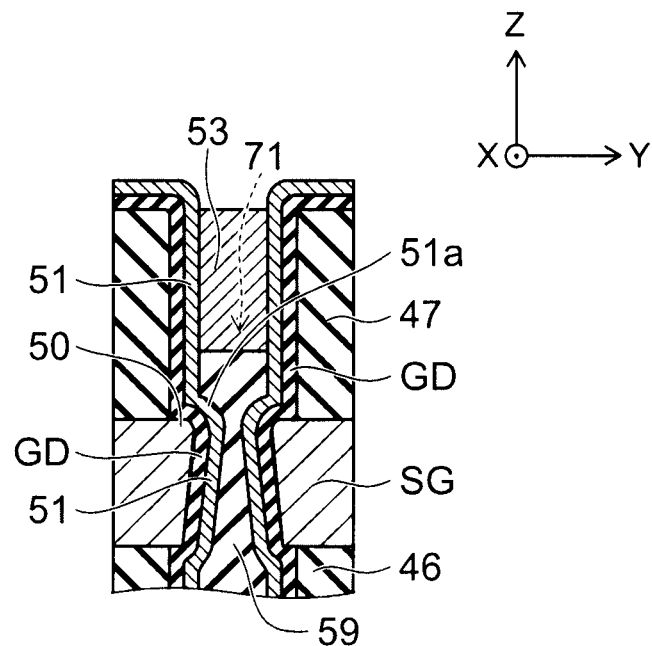
FIGS. 9A and 9B are cross-sectional schematic views for explaining the manufacturing process of the nonvolatile semiconductor memory device according to the first embodiment.

Then, as shown in FIG. 9A, an insulating layer 59 serving as a core material is embedded inside the channel body layer 51. Subsequently, on the insulating layer 59, a semiconductor layer 53 including an impurity element such as, for example, phosphorus (P) is formed.

Figure 9B:
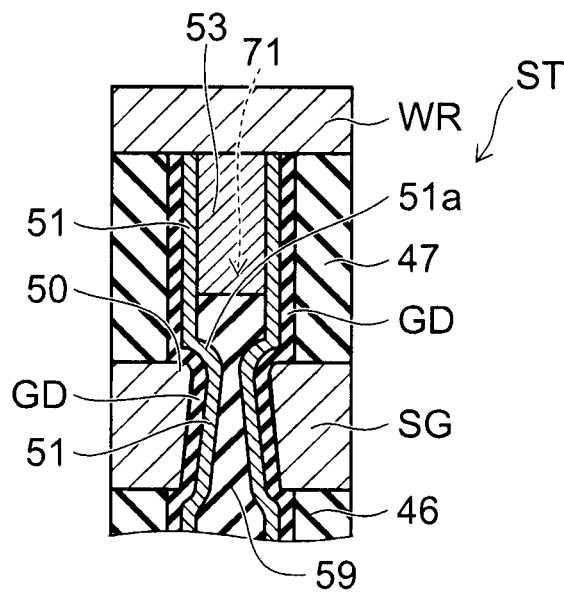

Next, as shown in FIG. 9B, the gate insulating film GD, the channel body layer 51 and the semiconductor layer 53 which are on an upper face of the insulating layer 47 are etched back by the RIE (Reactive Ion Etching). After that, the semiconductor layer 53 is formed into a polycrystalline silicon layer by a heat treatment. Thereby, the semiconductor layer serves as, for example, a polycrystalline silicon with phosphorus being doped as an impurity element. Subsequently, a wiring WR which is the bit line BL or the source line SL is formed on the channel body layer 51 and the semiconductor layer 53. Thereby, the channel body layer 51 and the semiconductor layer 53 are electrically connected to the wiring WR.

The impurity concentration of the step part 51a with the impurity element already doped by an ion implantation becomes further higher due to diffusion of the impurity element from the semiconductor layer 53. The step part 51a is a part of the channel body layer 51 which covers the step part 50. Therefore, in the channel body layer 51 in the vicinity of the upper end of the select gate SG, a diffusion region which contains an impurity element in a high concentration is reliably formed. As a result, using the GIDL current mentioned above, it is possible to boost a channel potential of a memory cell rapidly, and to increase a speed of the erasing operation.

In addition, the impurity element from the semiconductor layer 53 is diffused also into the channel body layer 51 formed on the side wall of the hole 71 higher than the step part 51a. As a result, it is possible to decrease a resistance of the upper part connected to the wiring WR in the channel body layer 51, and to increase a cell current at the time of reading-out.

Figure 10A:
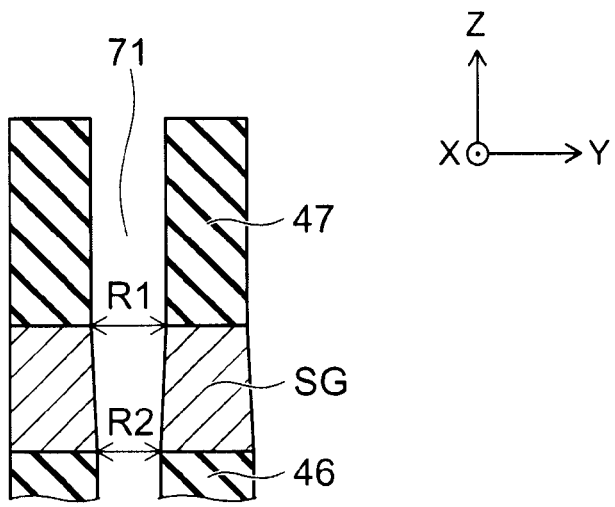
FIGS. 10A to 10C are cross-sectional schematic views for explaining a manufacturing process of a nonvolatile semiconductor memory device according to a reference example.

Then, a manufacturing process of the nonvolatile semiconductor memory device according to a reference example will be described. FIGS. 10A and 11B are cross-sectional schematic views for explaining the manufacturing process of the nonvolatile semiconductor memory device according to the reference example.

First, in FIG. 10A, a state in which the hole 71 is formed in the stacked body 48 and the interlayer insulating film 46 is shown.

In the reference example, in forming the hole 71, the RIE processing is performed so that a pore diameter of the hole 71 may become small gradually from the interface between the select gate SG and the insulating layer 47 toward the interface between the select gate SG and the interlayer insulating film 46 (pore diameter R1> pore diameter R2). A cross-sectional shape of the hole 71 is a so-called forward taper type.

Figure 10B:
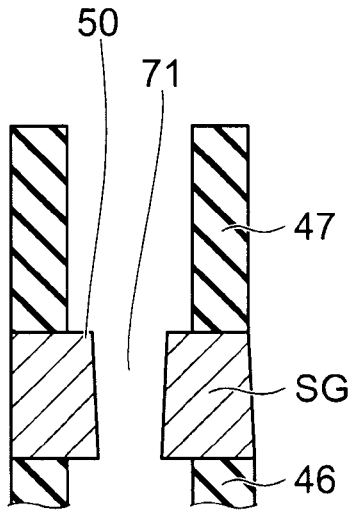

Then, as shown in FIG. 10B, an acid treatment is performed in the hole 71 by using dilute hydrofluoric acid. By the treatment, a side wall of the silicon-oxide-based insulating layer 47 is etched.

By the acid treatment, the side wall of the insulating layer 47 exposed to the hole 71 side is moved back in a direction apart from the center of the hole 71. Therefore, the step part 50 is formed in the interface between the select gate SG and the insulating layer 47.

Figure 10C:
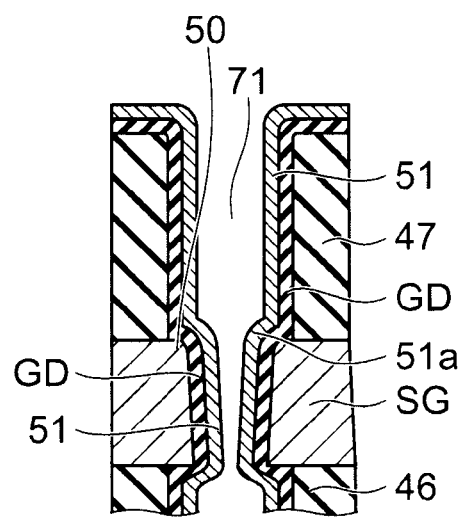

Next, as shown in FIG. 10C, the gate insulating film GD is formed on the side wall of the hole 71. The gate insulating film GD covers this step part 50 along the step part 50. Therefore, a step part is formed also on the gate insulating film GD.

Subsequently, the channel body layer 51 is formed inside the gate insulating film GD in the hole 71. The channel body layer 51 covers the step part 50 with the gate insulating film GD interposed. Therefore, the step part 51a is formed also on the channel body layer 51. Then, a high-concentration impurity element is caused to be contained in the channel body layer 51 in the vicinity of the upper end of the select gate SG. That is, the n-type impurity 58 is injected into the step part 51a of the channel body layer 51.

Figure 11A:
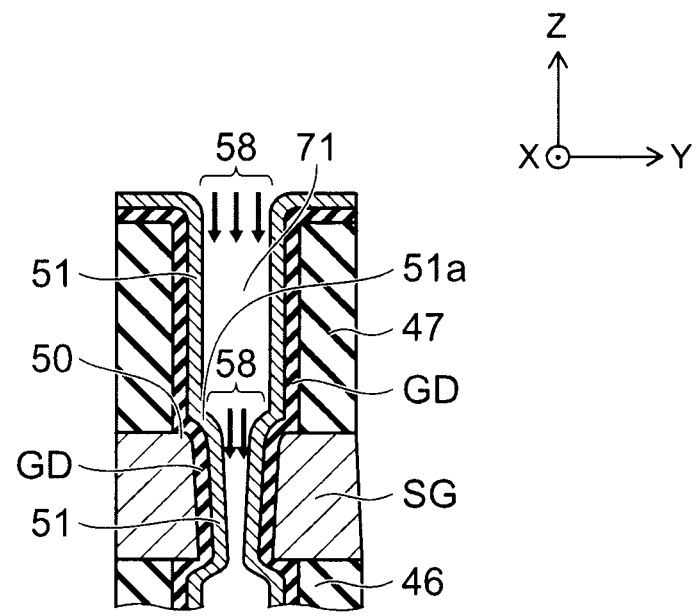
FIGS. 11A and 11B are cross-sectional schematic views for explaining the manufacturing process of the nonvolatile semiconductor memory device according to the reference example.
Figure 11B:
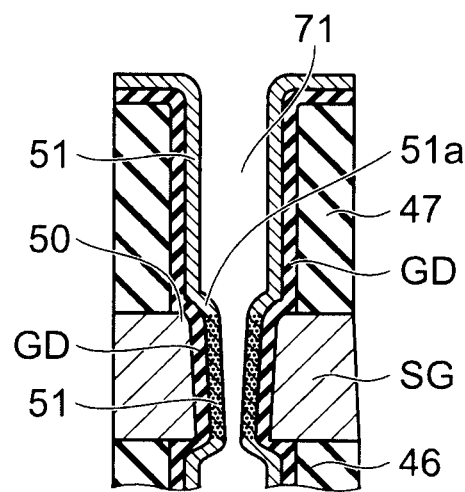

However, as shown in FIG. 11A, in the reference example, the pore diameter of the hole 71 has become small gradually from the interface between the select gate SG and the insulating layer 47 toward the interface between the select gate SG and the interlayer insulating film 46. Therefore, when an ion implantation of the n-type impurity 58 is tried into the step part 51a of the channel body layer 51 through the hole 71, the n-type impurity 58 enters into a portion lower than the step part 51a, and impurities are injected also into the channel body layer 51 contacting the gate insulating film GD which should be fundamentally intrinsic or have a low concentration to the fullest extent.

Therefore, in the reference example, as shown in FIG. 11B, an impurity element is injected into the channel body layer 51 contacting the gate insulating film GD, and data erasing operation malfunctioning described below is caused.

The data erasing operation is carried out by applying high potential to a source and drain provided on the select gate SG, and by using holes generated by the tunneling between bands.

For example, a lower voltage is applied to the select gate SG compared with the source line SL. Thereby, by an electric field between the select gate SG and the step part 51a connected to the source line SL, a depletion layer is generated in a diffusion layer of an upper end of the select gate SG. Since the concentration in the diffusion layer of this portion is sufficiently high, the width of the depletion layer formed is thin, and a high electric field is applied therebetween, and holes/electrons are generated by the tunneling between bands. Then, holes are supplied to the channel body layer 20 having lower electric potential. Thereby, an electric potential of the channel body layer 20 is increased.

In contrast, since the electrode layer WL which is a control gate is set as a low voltage at this time, electrons having stored in the charge storage film 32 are extracted by a potential difference between the low voltage and the increased electric potential of the channel body layer 20. Thereby, data are erased. On this occasion, there are cases in which holes generated by the tunneling between bands are directly injected into the charge storage film 32 and data are erased. In this way, for erasing of data, a high potential is applied to the source line, and a positive potential is also applied to a voltage of the select gate SG.

However, since the electric potential rising (charging) of the channel body layer 20 caused by the hole injection is small in an early stage in which an electric potential of the select gate SG is raised, the electric potential of the channel body layer 20 becomes lower than the electric potential of the select gate SG.

Then, when an impurity element is injected incorrectly into the channel body layer 51 contacting the gate insulating film GD, and when a region in which an impurity concentration is high is formed in the channel body layer 51 contacting the gate insulating film GD, a depletion layer is generated due to an electric field between the region in which the impurity concentration is high and the select gate SG. Therefore, the tunneling between bands is caused by the high electric field also in this depletion layer. Thereby, a hot hole/electron pair is generated.

A hot electron is accelerated to the side of the select gate SG in which an electric potential is higher than the channel body layer 20, and is trapped to the gate insulating film GD. Therefore, after an erasing operation, a threshold voltage of the select gate SG shifts to a positive side compared with an early threshold voltage. Because of this, in the reference example, there is a possibility that a sensing current for a read operation may decrease, and readout malfunctioning may be generated.

In contrast to this, in the nonvolatile semiconductor memory device 1 according to the first embodiment, a pore diameter is adjusted so that the pore diameter of the hole 71 may become large gradually from the interface between the select gate SG and the insulating layer 47 toward the interface between the select gate SG and the interlayer insulating film 46. Therefore, an impurity element is not injected incorrectly into the channel body layer 51 contacting the gate insulating film GD, and a region in which an impurity concentration is high is not formed in the channel body layer 51 contacting the gate insulating film GD. As a result, a threshold level variation of the select gate SG is difficult to be generated.

Therefore, even if a depleted state is generated between the channel body layer 51 and the select gates SG, a high electric field is not generated, and the tunneling between bands becomes difficult to be generated. Thereby, a hot hole/electron pair becomes difficult to be generated. Accordingly, a threshold voltage of the select gate SG does not shift to a positive side compared with an early threshold voltage, and a sensing current for a read operation becomes difficult to be decreased. As a result, a readout of data becomes stable.

Furthermore, in the first embodiment, a pore diameter is adjusted so that the pore diameter of the hole 71 becomes large gradually from the interface between the select gate SG and the insulating layer 47 toward the interface between the select gate SG and the interlayer insulating film 46. Correspondingly, compared with the reference example, an area in which the select gate SG contacts the channel body layer 51 via the gate insulating film GD increases. Therefore, a sensing current for a read operation increases compared with the reference example, and a readout of data becomes more stable.

Second Embodiment

Figure 12A:
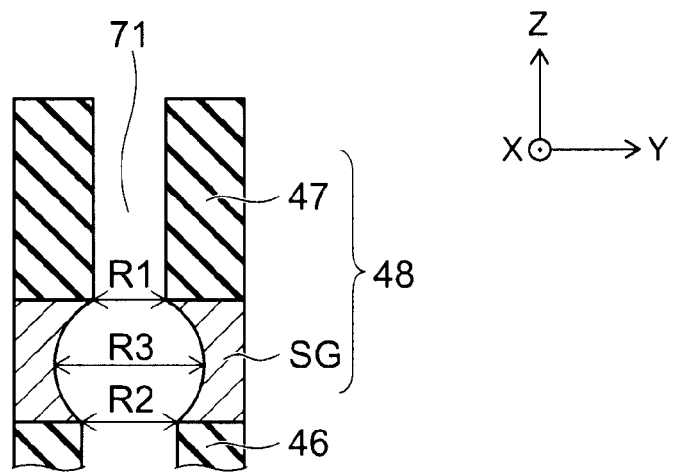
FIGS. 12A to 12C are cross-sectional schematic views for explaining a nonvolatile semiconductor memory device and a manufacturing process according to a second embodiment.
Figure 12B:
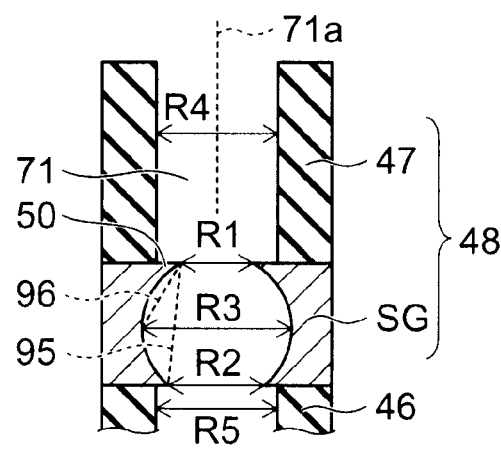
Figure 12C:
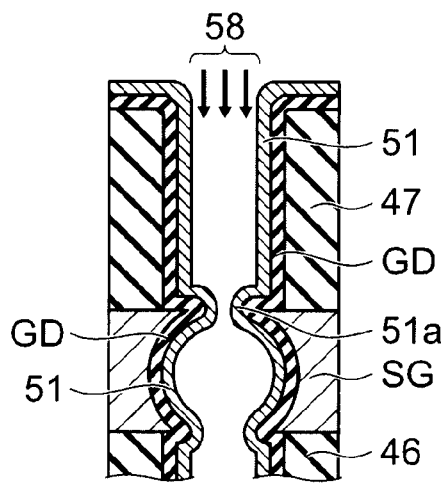

FIGS. 12A to 12C are cross-sectional schematic views for explaining a nonvolatile semiconductor memory device and a manufacturing process for the same according to a second embodiment.

First, in FIG. 12A, a state where the hole 71 is formed in the stacked body 48 and the interlayer insulating film 46 is shown.

In the second embodiment, in the case of forming the hole 71, the RIE processing is performed so that a pore diameter of the hole 71 may become large gradually from an interface between the select gate SG and the insulating layer 47 toward an interface between the select gate SG and the interlayer insulating film 46 (R1<R2). In addition, in the second embodiment, a pore diameter R3 (a third pore diameter) of the hole 71 between the interface between the select gate SG and the insulating layer 47 and the interface between the select gate SG and the interlayer insulating film 46 is caused to be larger than the pore diameter R1 and the pore diameter R2 (R1<R2<R3). A difference between the pore diameter R2 and the pore diameter R3 is, for example, 20 nanometers or more.

In the second embodiment, an inner wall of the select gate SG is caused to be a curved face. With respect to the pore diameters R1 and R2 according to the second embodiment, the dimensions may be caused to be the same as the pore diameters R1 and R2 according to the first embodiment. In the RIE processing according to the second embodiment, a hole having a shape like this is formed by adjusting oxygen (O), a carbon fluoride (CF)-based gas, types of gas such as a chlorine (Cl), flow rates of these gases, pressure in an etching apparatus, etching time, or the like.

In the second embodiment, up to the position of the pore diameter R3, as the process goes from the interface between the select gate SG and the insulating layer 47, toward the interface (position of the pore diameter R2) between the select gate SG and the interlayer insulating film 46, the process is caused to proceed on the condition that re-deposition of an atom and molecule removed by etching becomes difficult to be generated. On the other hand, in a portion lower than the position of the pore diameter R3, by switching to the condition in which the re-deposition to the side face becomes easy to be generated as the process goes to the interface between the select gate SG and the insulating layer 47, a shape can be realized in which etching in a side face direction by the RIE is difficult, and the lower the position goes downward from the position of the pore diameter R3, the smaller the pore diameter becomes.

Next, as shown in FIG. 12B, in the hole 71, an acid treatment is performed by using dilute hydrofluoric acid. By the treatment, the side wall of silicon-oxide-based insulating layer 47 is etched.

By the dilute-hydrofluoric-acid treatment, the side wall of the of the hole 71 side of the insulating layer 47 is moved back in a direction apart from the center of the hole 71. Therefore, the step part 50 is formed between the select gate SG and the insulating layer 47. For example, a difference between the pore diameter R4 of the hole 71 of the insulating layer 47 side in the interface between the select gate SG and the insulating layer 47 and the pore diameter R1 is not less than 10 nanometers (nm). In this stage, in the interface of the select gate SG and the insulating layer 47, the step part 50 is formed between the select gate SG and the insulating layer 47.

The pore diameter R5 of the interlayer insulating film 46 increases like the insulating layer 47 by dilute-hydrofluoric-acid treatment. In order to prevent short-circuiting with an adjacent bit, the pore diameter R5 of the interlayer insulating film 46 before the dilute-hydrofluoric-acid treatment is set as a dimension smaller than a dimension after the dilute-hydrofluoric-acid treatment. For example, in the case where a difference between the pore diameter R4 and the pore diameter R1 is 10 nanometers, an adjustment is carried out so that a difference between the pore diameter R5 before the dilute-hydrofluoric-acid treatment and the pore diameter R5 after the dilute-hydrofluoric-acid treatment is also 10 nanometers.

In contrast to this, since the pore diameter R3 is possible to be adjusted in a silicon layer, the pore diameter R3 is possible to have a dimension larger than the pore diameter R5 (R5<R3).

Then, as shown in FIG. 12C, the gate insulating film GD is formed on the side wall of the hole 71. The gate insulating film GD covers this step part 50 along the step part 50. Therefore, a step part is formed also on the gate insulating film GD. Subsequently, the channel body layer 51 is formed inside the gate insulating film GD in the hole 71.

The channel body layer 51 covers the step part 50 with the gate insulating film GD interposed. Therefore, the step part 51a is formed also on the channel body layer 51. Then, through the hole 71, the n-type impurity 58 as a high concentration impurity element is injected into the step part 51a of the channel body layer 51.

Here, as shown in FIG. 12B, a line which connects the select gate SG at a position of the pore diameter R1 and the select gate SG at a position of the pore diameter R2 is set as a line 95. In addition, a line which connects the select gate SG at a position of the pore diameter R1 and the select gate SG at a position of the pore diameter R3 is set as a line 96.

In the second embodiment, since there is a relation of the pore diameter R1< the pore diameter R2< the pore diameter R3, an angle between the line 96 and the central axis 71a becomes larger than an angle between the line 95 and the central axis 71a of the hole 71. Therefore, in the second embodiment, compared with the first embodiment, the n-type impurity 58 becomes further difficult to be incident into the channel body layer 51 formed on the side wall of the select gate SG via the gate insulating film GD.

For example, in an ion implanter, in the case where an incident angle of an impurity element has an error, an amount of an impurity element which runs nonparallel to the central axis 71a of the hole 71 increases. In such a case, if the select gate SG which has a relation of the pore diameter R1< the pore diameter R2< the pore diameter R3 is formed in advance, an impurity element is hard to be injected incorrectly into the channel body layer 51 formed on the side wall of the select gate SG.

Moreover, in the second embodiment, the pore diameter R3 is larger than the pore diameter R1 and R2. Correspondingly, compared with the first embodiment, an area in which the select gate SG contacts the channel body layer 51 via the gate insulating film GD increases further. Therefore, a sensing current for a read operation further increases compared with the first embodiment, and a readout of data becomes more stable. A nonvolatile semiconductor memory device of such a mode is also included in an embodiment.

Third Embodiment

Figure 13A:
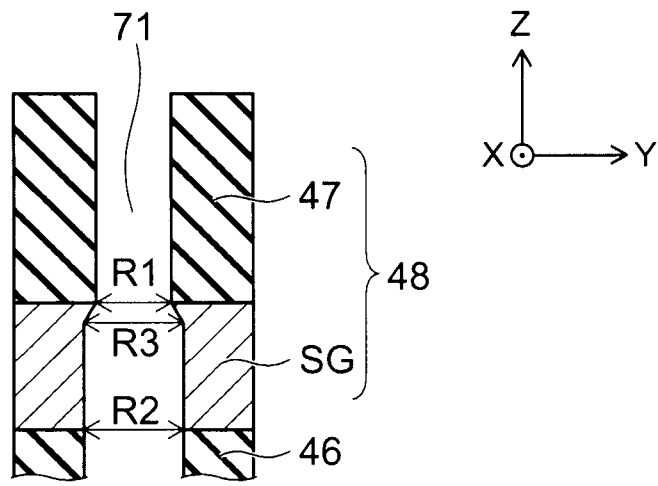
FIGS. 13A to 13C are cross-sectional schematic views for explaining a nonvolatile semiconductor memory device and a manufacturing process for the same according to a third embodiment.
Figure 13B:
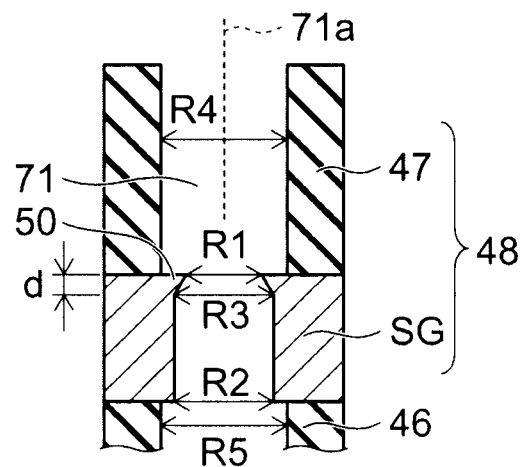
Figure 13C:
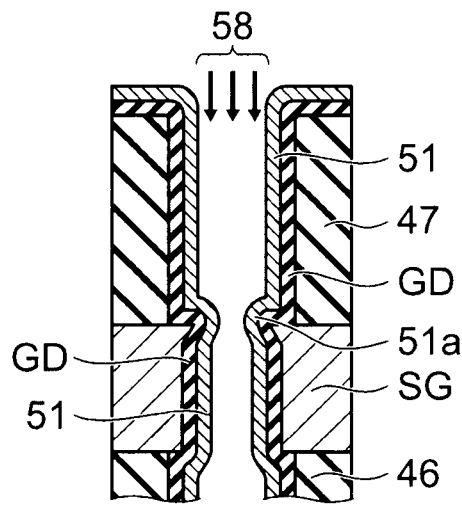

FIGS. 13A to 13C are cross-sectional schematic views for explaining a nonvolatile semiconductor memory device and a manufacturing process for the same according to a third embodiment.

First, in FIG. 13A, a state where the hole 71 is formed in the stacked body 48 and the interlayer insulating film 46 is shown.

In the third embodiment, in the case of forming the hole 71, the RIE processing is performed so that a pore diameter R3 of the hole 71 at a prescribed position between an interface between the select gate SG and the insulating layer 47 and an interface between the select gate SG and the interlayer insulating film 46 becomes larger than the pore diameter R1. In the figure, a depth from an upper end of the select gate SG to the above-mentioned prescribed position is set as a depth d. In addition, the RIE processing is performed so that a pore diameter of the hole 71 from the above-mentioned prescribed position to an interface between the select gate SG and the interlayer insulating film 46 becomes substantially the same. That is, the pore diameter R1 is smaller than the pore diameter R2, and the pore diameter R3 and the pore diameter R2 are substantially equal.

In the third embodiment, a cross section of the hole 71 formed in the select gate SG is set so as to be a reverse taper type up to the depth d, and so as to be a straight type from the depth d to the interface between the select gate SG and the interlayer insulating film 46. The pore diameter R1 and R2 according to the third embodiment is set so as to have the same dimension as the pore diameter R1 and R2 according to the first embodiment. In the RIE processing according to the third embodiment, a hole having a shape like this is formed by adjusting oxygen (O), a carbon fluoride (CF)-based gas, types of gas such as a chlorine (Cl), flow rates of these gases, pressure in an etching apparatus, etching time, or the like.

For example, in the third embodiment, a process is caused to proceed so that an etching rate becomes fast gradually from the interface between the select gate SG and the insulating layer 47, up to the above-mentioned prescribed position, and a process is caused to proceed with the same etching rate while maintaining the fast etching rate from the above-mentioned prescribed position, up to the interface between the select gate SG and the insulating layer 46.

Alternatively, in the third embodiment, from the interface between the select gate SG and the insulating layer 47, up to the above-mentioned prescribed position, as the process goes toward the above-mentioned prescribed position, the process is caused to proceed on the condition that re-deposition of an atom and molecule removed by etching becomes difficult to be generated. Up to the interface between the select gate SG and the insulating layer 46 from the above-mentioned prescribed position, a process is caused to proceed on the condition that the extent of re-deposition becomes the same.

Then, as shown in FIG. 13B, in the hole 71, an acid treatment is performed by using dilute hydrofluoric acid. By the treatment, the side wall of silicon-oxide-based insulating layer 47 is etched.

By the dilute-hydrofluoric-acid treatment, the side wall of the of the hole 71 side of the insulating layer 47 is moved back in a direction apart from the center of the hole 71. Therefore, the step part 50 is formed between the select gate SG and the insulating layer 47. For example, a difference between the pore diameter R4 of the hole 71 of the insulating layer 47 side in the interface between the select gate SG and the insulating layer 47 and the pore diameter R1 is not less than 10 nanometers (nm). In this stage, in the interface of the select gate SG and the insulating layer 47, the step part 50 is formed between the select gate SG and the insulating layer 47. In addition, the pore diameter R5 of the interlayer insulating film 46 also increases like in the case of the insulating layer 47 by the dilute-hydrofluoric-acid treatment.

Next, as shown in FIG. 13C, the gate insulating film GD is formed on the side wall of the hole 71. The gate insulating film GD covers this step part 50 along the step part 50. Therefore, a step part is formed also on the gate insulating film GD. Subsequently, the channel body layer 51 is formed inside the gate insulating film GD in the hole 71.

The channel body layer 51 covers the step part 50 with the gate insulating film GD interposed. Therefore, the step part 51a is formed also on the channel body layer 51. After that, through the hole 71, the n-type impurity 58 as a high concentration impurity element is injected into the step part 51a of the channel body layer 51.

In the third embodiment, the channel body layers 51 other than the step part 51a of the channel body layer 51 is moved back to the select gate SG side from the step part 51a. Therefore, also in the third embodiment, the n-type impurity 58 becomes difficult to be incident into the channel body layer 51 formed on the side wall of the select gate SG via the gate insulating film GD.

Furthermore, in the third embodiment, a pore diameter of the hole 71 at a position deeper than the depth d is uniform, and is larger than the pore diameter R1. Therefore, compared with the first embodiment, an area in which the select gate SG contacts the channel body layer 51 via the gate insulating film GD increases further. Therefore, a sensing current for a read operation increases further compared with the first embodiment, and a readout of data becomes more stable.

Moreover, in the third embodiment, since a pore diameter of the hole 71 at a position deeper than the depth d is controlled uniformly, the cross-sectional shape of the channel body layer 51 deeper than depth d also becomes uniform. Therefore, in the third embodiment, a threshold voltage and a sub-threshold coefficient (S value) of a select gate are difficult to be changed. A nonvolatile semiconductor memory device of such a mode is also included in an embodiment.

Fourth Embodiment

Figure 14:
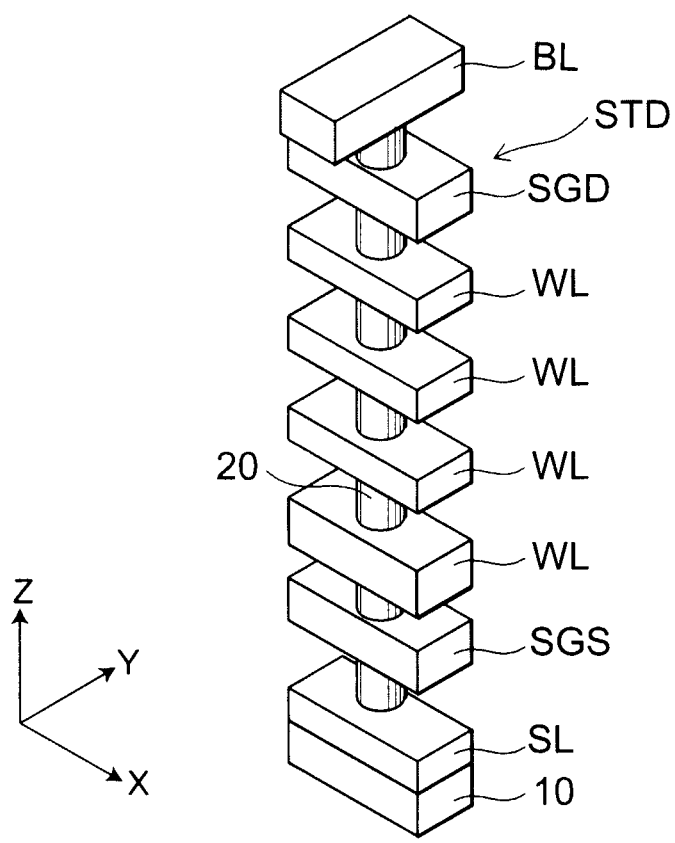
FIG. 14 is a schematic perspective view for explaining a nonvolatile semiconductor memory device according to a fourth embodiment.

FIG. 14 is a schematic perspective view for explaining a nonvolatile semiconductor memory device according to a fourth embodiment.

Memory strings are not limited to be U-shaped, and may be I-shaped as shown in FIG. 14. In FIG. 14, a conductive part is shown, and illustration of an insulating part is omitted.

In the structure, a source line SL is provided on the substrate 10, and a source side select gate (or lower select gate) SGS is provided thereon, and a plurality of electrode layers WL (for example, four layers) are provided thereon, and a drain side select gate (or upper select gate) SGD is provided between the electrode layer WL of the uppermost layer and a bit line BL.

In the structure, a process and structure described above with reference to FIGS. 4 to 9 are applied to the drain side selection transistor STD provided on an upper end part of the memory strings.

Hereinabove, exemplary embodiments are described with reference to specific examples. However, the embodiments are not limited to these specific examples. That is, also ones in which a person skilled in the art has added a design modification to the specific examples appropriately, are included within the scope of the embodiments to the extent that they are provided with characteristics of the embodiments. Each component and arrangement thereof, material, conditions, shape, size, etc., which each of the specific examples described above includes are not limited to ones illustrated, and are able to be modified appropriately.

Further, each of components which each of the embodiments mentioned above includes is able to be compounded to the extent that they are technically possible, and ones which combines these also are included within the scope of the embodiments to the extent that they include the characteristics of the embodiments. Moreover, it should be understood that in the concept category of the embodiments, a person skilled in the art could have been able to conceive various kinds of the change examples and modification examples, and these change examples and modification examples also are included within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device, comprising:
   a first stacked body having a plurality of electrode layers and a plurality of first insulating layers which are stacked alternately;
   a memory film provided on a side wall of a first hole penetrating the first stacked body in a stacking direction of the first stacked body;
   a first channel body layer provided inside the memory film provided in the first hole;
   an interlayer insulating film provided on the first stacked body;
   a second stacked body having a select gate electrode layer provided on the interlayer insulating film, and a second insulating layer provided on the select gate electrode layer;
   a gate insulating film provided on a side wall of a second hole communicating with the first hole and penetrating the second stacked body and the interlayer insulating film in a stacking direction of the second stacked body; and
   a second channel body layer provided inside the gate insulating film in the second hole, and connected to the first channel body layer,
   a first pore diameter of the second hole at an upper end of the select gate electrode layer being smaller than a second pore diameter of the second hole at an lower end of the select gate electrode layer.

2. The device according to claim 1, wherein a pore diameter of the second hole becomes gradually larger from the upper end toward the lower end of the select gate electrode layer.

3. The device according to claim 1, wherein a third pore diameter of the second hole between the upper end and the lower end is larger than the first pore diameter.

4. The device according to claim 3, wherein the third pore diameter is larger than the second pore diameter.

5. The device according to claim 1, wherein a third pore diameter of the second hole at a position between the upper end and the lower end is larger than the first pore diameter, and a pore diameter of the second hole from a position of the third pore diameter to the lower end is substantially constant.

6. The device according to claim 1, wherein a difference between the first pore diameter and the second pore is 5 nanometers or more.

7. The device according to claim 1, wherein a part of the second channel body layer includes impurity, the part is provided inside the second hole which penetrates the second insulating layer.

8. The device according to claim 1, wherein a part of the second channel body layer includes impurity whose concentration is not less than $5\times10^{19}$ atoms/cm$^3$, the part is provided inside the second hole which penetrates the second insulating layer.

9. The device according to claim 1, wherein a fourth pore diameter of the second hole at a lower end of the second insulating layer is larger than the first pore diameter.

10. The device according to claim 9, wherein a difference between the first pore diameter and the fourth pore is 10 nanometers or more.

11. A nonvolatile semiconductor memory device, comprising:
- a first stacked body having a plurality of electrode layers and a plurality of first insulating layers which are stacked alternately;
- a memory film provided on a side wall of a first hole penetrating the first stacked body in a stacking direction of the first stacked body;
- a first channel body layer provided inside the memory film provided in the first hole;
- an interlayer insulating film provided on the first stacked body;
- a second stacked body having a select gate electrode layer provided on the interlayer insulating film, and a second insulating layer provided on the select gate electrode layer;
- a gate insulating film provided on a side wall of a second hole communicating with the first hole and penetrating the second stacked body and the interlayer insulating film in a stacking direction of the second stacked body; and
- a second channel body layer provided inside the gate insulating film in the second hole, and connected to the first channel body layer,
- a first pore diameter of the second hole of the select gate electrode layer side in a first interface between the select gate electrode layer and the second insulating layer being smaller than a second pore diameter of the second hole of the select gate electrode layer side in a second interface between the select gate electrode layer and the interlayer insulating film.

12. The device according to claim 11, wherein a pore diameter of the second hole becomes gradually larger from the first interface toward the second interface.

13. The device according to claim 11, wherein a third pore diameter of the second hole between the first interface and the second interface is larger than the first pore diameter.

14. The device according to claim 13, wherein the third pore diameter is larger than the second pore diameter.

15. The device according to claim 11, wherein a third pore diameter of the second hole at a position between the first interface and the second interface is larger than the first pore diameter, and a pore diameter of the second hole from a position of the third pore diameter to the second interface is substantially constant.

16. The device according to claim 11, wherein a difference between the first pore diameter and the second pore diameter is 5 nanometers or more.

17. The device according to claim 11, wherein a fourth pore diameter of the second hole of the second insulating layer side in the first interface is larger than the first pore diameter.

* * * * *